United States Patent
Tzeng et al.

(10) Patent No.: US 11,664,614 B2
(45) Date of Patent: May 30, 2023

(54) SCREW BOSS ASSEMBLY

(71) Applicant: Dell Products L.P., Round Rock, TX (US)

(72) Inventors: Spike Tzeng, KeeLung (TW); Yong-Teng Lin, Yilan County (TW); Po-Min Shih, Beitou Dist. (TW)

(73) Assignee: Dell Products L.P., Round Rock, TX (US)

( * ) Notice: Subject to any disclaimer, the term of this patent is extended or adjusted under 35 U.S.C. 154(b) by 133 days.

(21) Appl. No.: 17/444,583

(22) Filed: Aug. 6, 2021

(65) Prior Publication Data
US 2023/0037468 A1  Feb. 9, 2023

(51) Int. Cl.
*H01R 12/58* (2011.01)
*H05K 1/02* (2006.01)

(52) U.S. Cl.
CPC .......... *H01R 12/58* (2013.01); *H05K 1/0215* (2013.01); *H05K 2201/10393* (2013.01); *H05K 2201/10409* (2013.01)

(58) Field of Classification Search
CPC .................. H01R 12/58; H05K 1/0215; H05K 2201/10393; H05K 2201/10409
See application file for complete search history.

(56) References Cited

U.S. PATENT DOCUMENTS

| | | | | |
|---|---|---|---|---|
| 10,496,137 B1 * | 12/2019 | Dickenson | ............ | G06F 1/1658 |
| 11,500,427 B1 * | 11/2022 | Wang | ...................... | H05K 1/111 |
| 11,563,283 B2 * | 1/2023 | Schikora | ................ | H05K 7/142 |
| 2020/0196436 A1 * | 6/2020 | Jandt | ...................... | H05K 1/116 |
| 2020/0266562 A1 * | 8/2020 | Park | ...................... | H05K 5/0004 |
| 2022/0201862 A1 * | 6/2022 | Hsu | ..................... | H05K 7/14329 |
| 2022/0316517 A1 * | 10/2022 | Wang | ........................ | H05K 1/02 |
| 2023/0037468 A1 * | 2/2023 | Tzeng | ..................... | H01R 12/58 |

\* cited by examiner

*Primary Examiner* — Truc T Nguyen
(74) *Attorney, Agent, or Firm* — McDermott Will & Emery LLP (57) ABSTRACT

A screw boss assembly, including: a plastic substrate, including: a bottom surface including a first channel; an indented surface; a sidewall surface connecting the bottom surface and the indented surface, the sidewall surface including second channels, each of the second channels connected to the first channel; a metal insert, including: a first contacting member; second contacting member; connecting members connecting the first contacting member to the second contacting member; wherein the metal insert is coupled with the plastic substrate such that the first contacting member is positioned within the first channel and the connecting members are positioned within respective second channels.

20 Claims, 10 Drawing Sheets

SCREW BOSS ASSEMBLY

BACKGROUND

Field of the Disclosure

The disclosure relates generally to an information handling system, and in particular, a screw boss assembly for use within the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a method of a screw boss assembly, including: a plastic substrate, including: a bottom surface including a first channel; an indented surface; a sidewall surface connecting the bottom surface and the indented surface, the sidewall surface including second channels, each of the second channels connected to the first channel; a metal insert, including: a first contacting member; second contacting member; connecting members connecting the first contacting member to the second contacting member; wherein the metal insert is coupled with the plastic substrate such that the first contacting member is positioned within the first channel and the connecting members are positioned within respective second channels.

Other embodiments of these aspects include corresponding systems and apparatus.

These and other embodiments may each optionally include one or more of the following features. For instance, wherein the metal insert is coupled with the plastic substrate such that the second contacting member is positioned adjacent to the indented surface. The first contacting member is positioned within the first channel such that a surface of the first contacting member is flush with the bottom surface of the plastic substrate. The connecting members are positioned within respective second channels such that respective surfaces of the connecting members are flush with the sidewall surface of the plastic substrate. The plastic substrate includes an egress. The plastic substrate further includes a top surface positioned opposite to the bottom surface, the top surface including openings, wherein the metal insert includes tabs extending from the second contacting member, wherein the metal insert is coupled with the plastic substrate such that the tabs of the metal insert are positioned with the openings of the plastic substrate. The metal insert is coupled with the plastic substrate such that the tabs of the metal insert are positioned with the openings of the plastic substrate and flush with the top surface of the plastic substrate. The metal insert is coupled with the plastic substrate such that the tabs of the metal insert are positioned with the openings of the plastic substrate and extend above the top surface of the plastic substrate. The first contacting member includes extension contacting members extending from the first contacting member, the extension contacting members connected the first contacting member with the connecting members. The first contacting member of the metal insert is in electrical contact with a structural boss when the screw boss assembly is positioned adjacent to the structural boss. The second contacting member of the metal insert is in electrical contact with a circuit board when the screw boss assembly is positioned adjacent to the circuit bord. The tabs of the metal insert are in electrical contact with a conductive insert when the screw boss assembly is positioned adjacent to the conductive insert. The plastic substrate is in thermal contact with a screw and a structural boss.

Particular implementations of the subject matter described in this specification can be implemented so as to realize one or more of the following advantages. For example, an improved skin temperature of the information handling can be obtained, while concurrently providing electrical connection that is compliant with contact/mounting conditions.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This disclosure discusses a screw boss assembly for an information handling system. In short, the screw boss assembly can provide i) electrical grounding connection for a printed circuit board to a structural boss assembly while also providing ii) heat resistance between a fastener, the PCB, and a structural boss assembly.

Specifically, this disclosure discusses a screw boss assembly, including: a plastic substrate, including: i) a bottom surface including a first channel; ii) an indented surface; iii) a sidewall surface connecting the bottom surface and the indented surface, the sidewall surface including second channels, each of the second channels connected to the first channel; a metal insert, including: i) a first contacting member; a second contacting member; connecting members connecting the first contacting member to the second contacting member; wherein the metal insert is coupled with the plastic substrate such that the first contacting member is positioned within the first channel and the connecting members are positioned within respective second channels.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-6 wherein like numbers are used to indicate like and corresponding parts.

Figure 1:
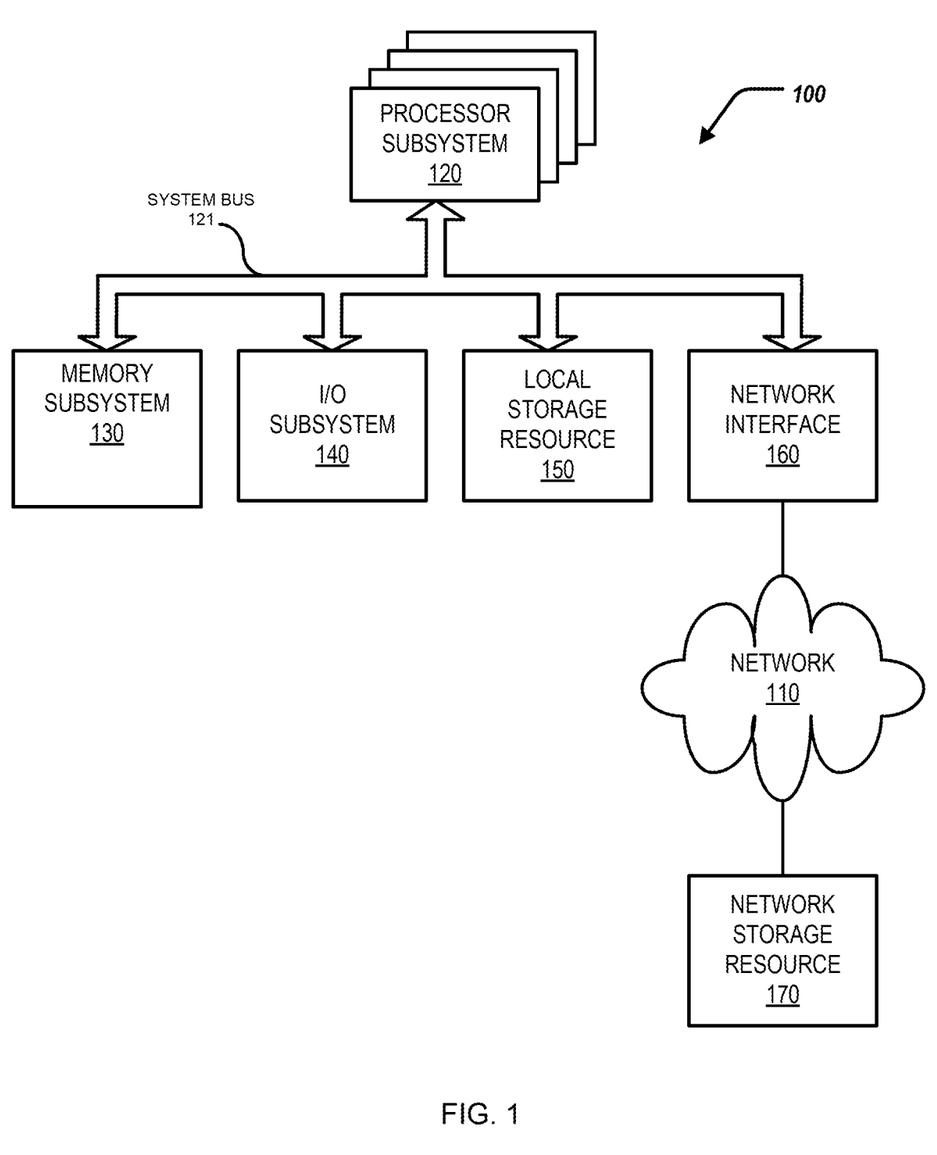
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on a network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
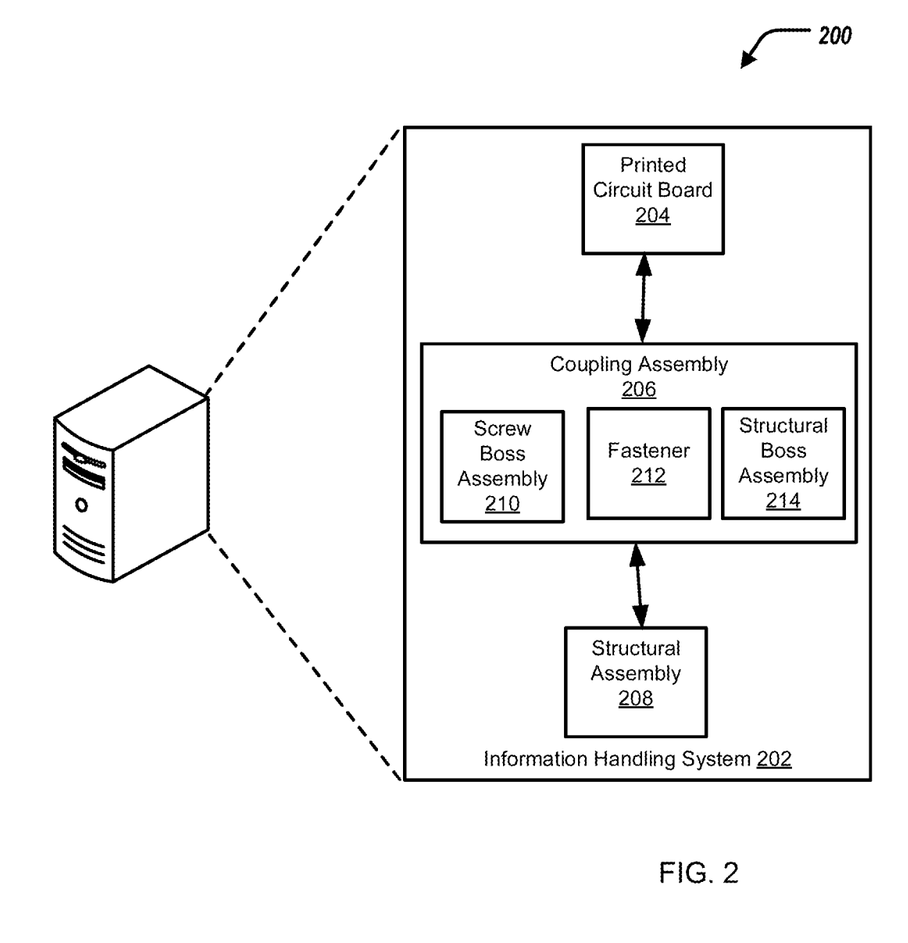
FIG. 2 illustrates a block diagram of the information handling system.

Turning to FIG. 2, FIG. 2 illustrates an environment 200 including an information handling system 202. The information handling system 202 can include a printed circuit board (PCB) 204, a coupling assembly 206, and a structural assembly 208. In some examples, the information handling system 202 is similar to, or includes, the information handling system 100 of FIG. 1.

The printed circuit board 204 can include any type of circuit board, such as a motherboard, or a computing card.

The coupling assembly 206 can include a screw boss assembly 210, a fastener 212, and a structural boss assembly 214. The coupling assembly 210 can couple the PCB 204 to the structural assembly 208. The fastener 212 can include any type of fastener, including a screw. The structural boss assembly 214 can be electrically conductive.

The structural assembly 208 can include any structural element of the information handling system 202, such as an outer shell of the information handling system 202.

In short, the screw boss assembly 210 can provide i) electrical grounding connection for the PCB 204 to the structural boss assembly 214 while also providing ii) heat resistance between the fastener 212, the PCB 204, and the structural boss assembly 214.

Figure 3A:
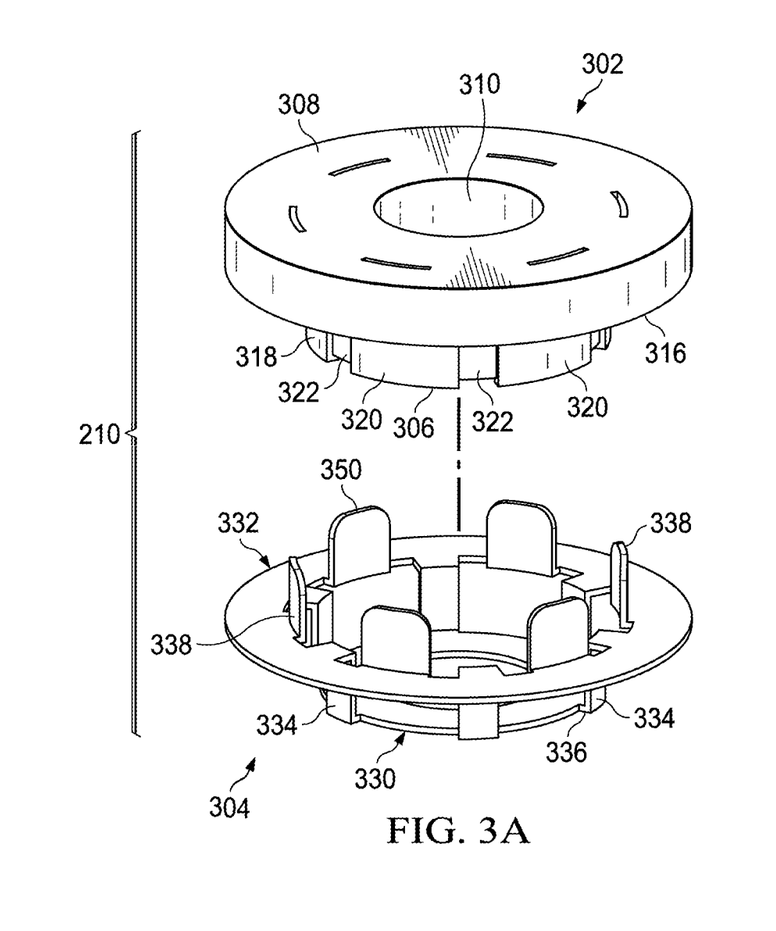
FIGS. 3A, 3B illustrates exploded view of a screw boss assembly.
Figure 3B:
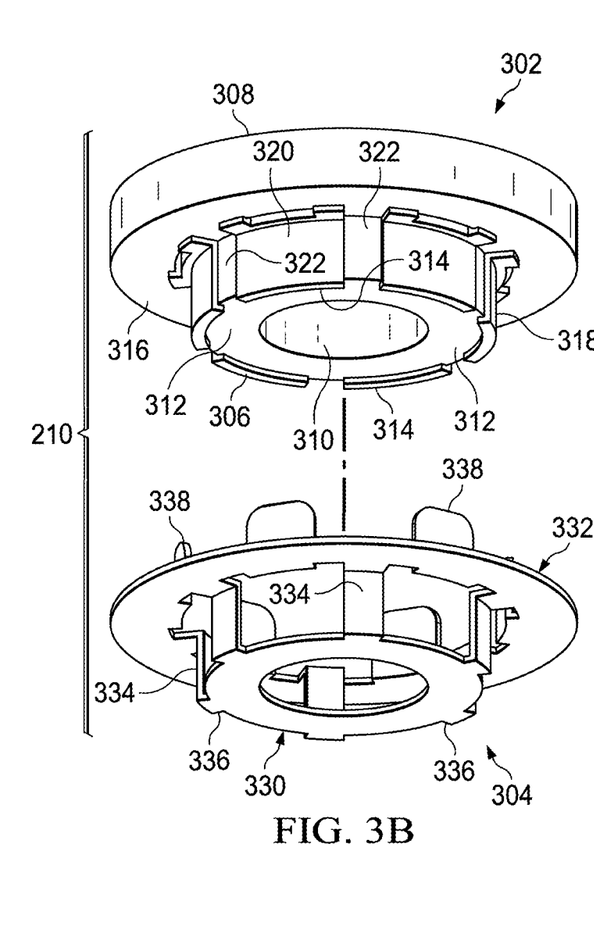

FIGS. 3A, 3B illustrate perspective views of the screw boss assembly 210. The screw boss assembly 210 can include a substrate 302 and an insert 304. In some examples, the substrate 302 is a plastic substrate. In some examples, the insert 304 is a metal insert. In some examples, the insert 304 is electrically conductive. In some examples, the substrate 302 is insulative.

Figure 4A:
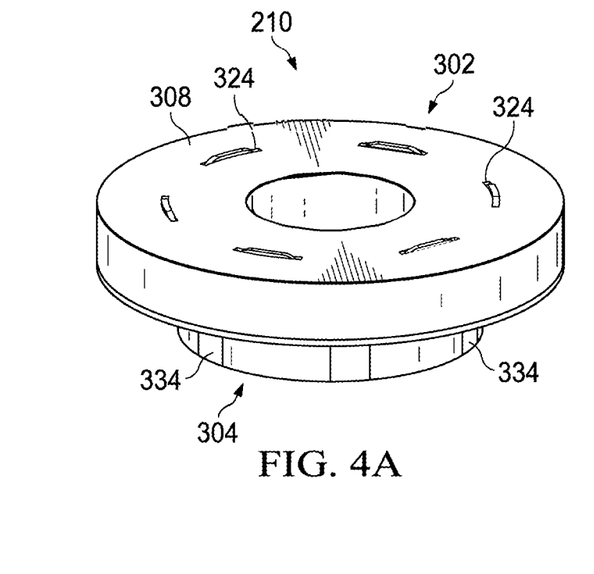
FIGS. 4A, 4B illustrate perspective views of the screw boss assembly.

The substrate 302 can include a bottom surface 306 and a top surface 308. The top surface 308 can be positioned opposite to the bottom surface 306. The substrate 302 can further include an egress 310 positioned between the bottom surface 306 and the top surface 308. The bottom surface 306 can include protrusions 314 extending from the bottom surface 306. The bottom surface 306 can further include a first channel 312. The first channel 312 can extend between protrusions 314 of the bottom surface 306 to the egress 310. In some examples, the first channel 310 can substantially surround the egress 310. The substrate 302 can further include an indented surface 316. The substrate 302 can further include a sidewall surface 318 that connects the bottom surface 306 and the indented surface 316. The sidewall surface 318 can include protrusions 320 extending from the sidewall surface 318. The protrusions 320 can be structurally contiguous with the protrusions 314. The sidewall surface 318 can include second channels 322. The second channels 322 can be defined between the protrusions 320. Each of the second channels 322 can be connected to the first channel 312. The top surface 308 of the substrate 302 can further include openings 324, as shown in FIG. 4A. The openings 324 can extend between the top surface 308 and the indented surface 316.

The insert 304 can include a first contacting member 330 and a second contacting member 332. The insert 304 can further include connecting members 334 connecting the first contacting member 330 and the second contacting member 332. The first contacting member 330 can further include extension contacting members 336 extending from the first contacting member 330. The extension contacting members 336 connect the first contacting member 330 with the connecting members 334. The insert 304 can further include tabs 338 extending from the second contacting member 332. The insert 304 can be electrically conductive.

Figure 4B:
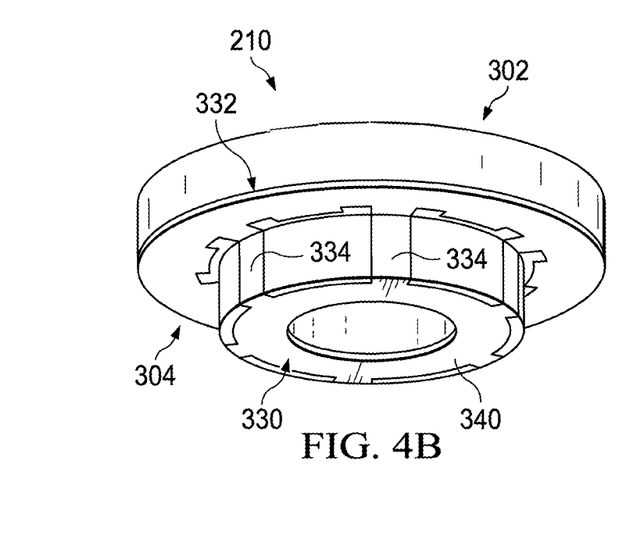

FIGS. 4A, 4B perspective views of the screw boss assembly 210. Specifically, the insert 304 is coupled with the substrate 302. The insert 304 is coupled with the substrate 302 such that i) the first contacting member 330 is positioned within the first channel 312, and ii) the connecting members 334 are positioned within respective second channels 322. Moreover, when the first contacting member 330 is positioned within the first channel 312, a surface 340 of the first contacting member 330 is flush, or substantially flush, with the bottom surface 306 of the substrate 302. Specifically, when the first contacting member 330 is positioned within the first channel 312, the surface 340 of the first contacting member 330 is flush, or substantially flush, with the protrusions 314.

Furthermore, when the insert 304 is coupled with the substrate 302, the second contacting member 332 is positioned adjacent to the indented surface 316.

Further, when the insert 304 is coupled with the substrate 302, the tabs 338 of the insert 304 are positioned within the openings 324 of the substrate 302. In some examples, when the tabs 338 of the insert 304 are positioned within the openings 324 of the substrate 302, the tabs 338 are flush, or substantially flush, with the top surface 308 of the substrate 302. That is, a distal end 350 of the tabs 338 (shown in FIG. 3A) are flush, or substantially flush, with the top surface 308 of the substrate 302. In some examples, when the tabs 338 of the insert 304 are positioned within the openings 324 of the substrate 302, the tabs 338 extend above/beyond the top surface 308 of the substrate 302. That is, the distal end 350 of the tabs 338 (shown in FIG. 3A) extend above/beyond the top surface 308 of the substrate 302.

Figure 5A:
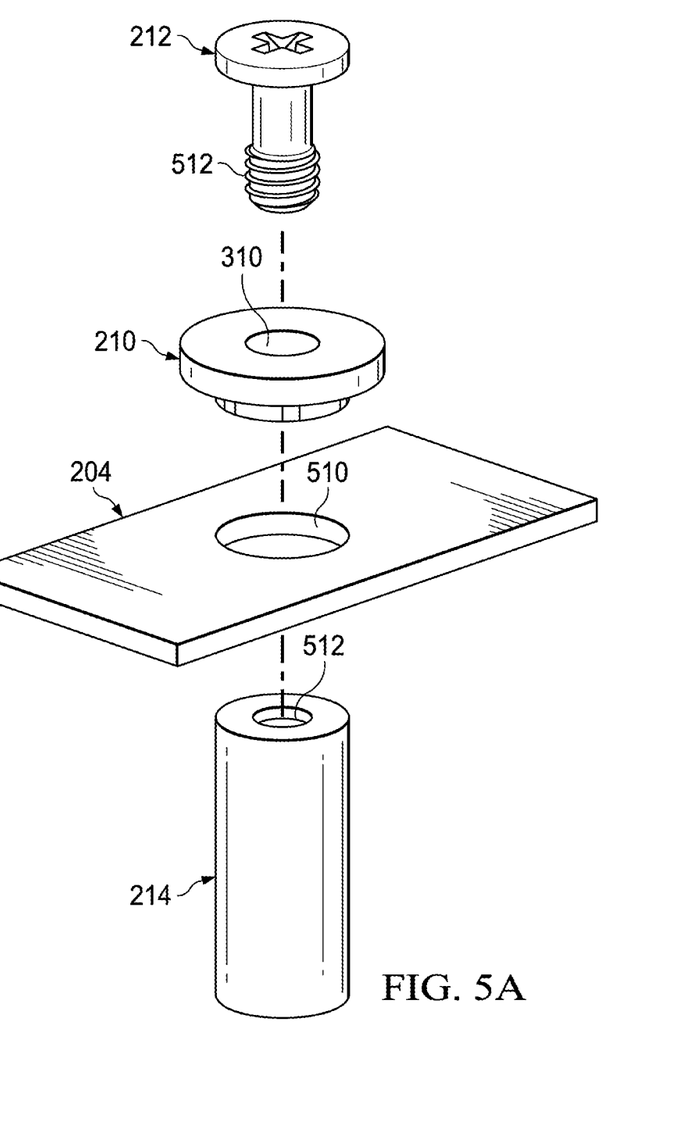
FIGS. 5A, 5B, 5C illustrate coupling between a screw, the screw boss assembly, a printed circuit board, and a structural boss, in a first implementation.
Figure 5B:
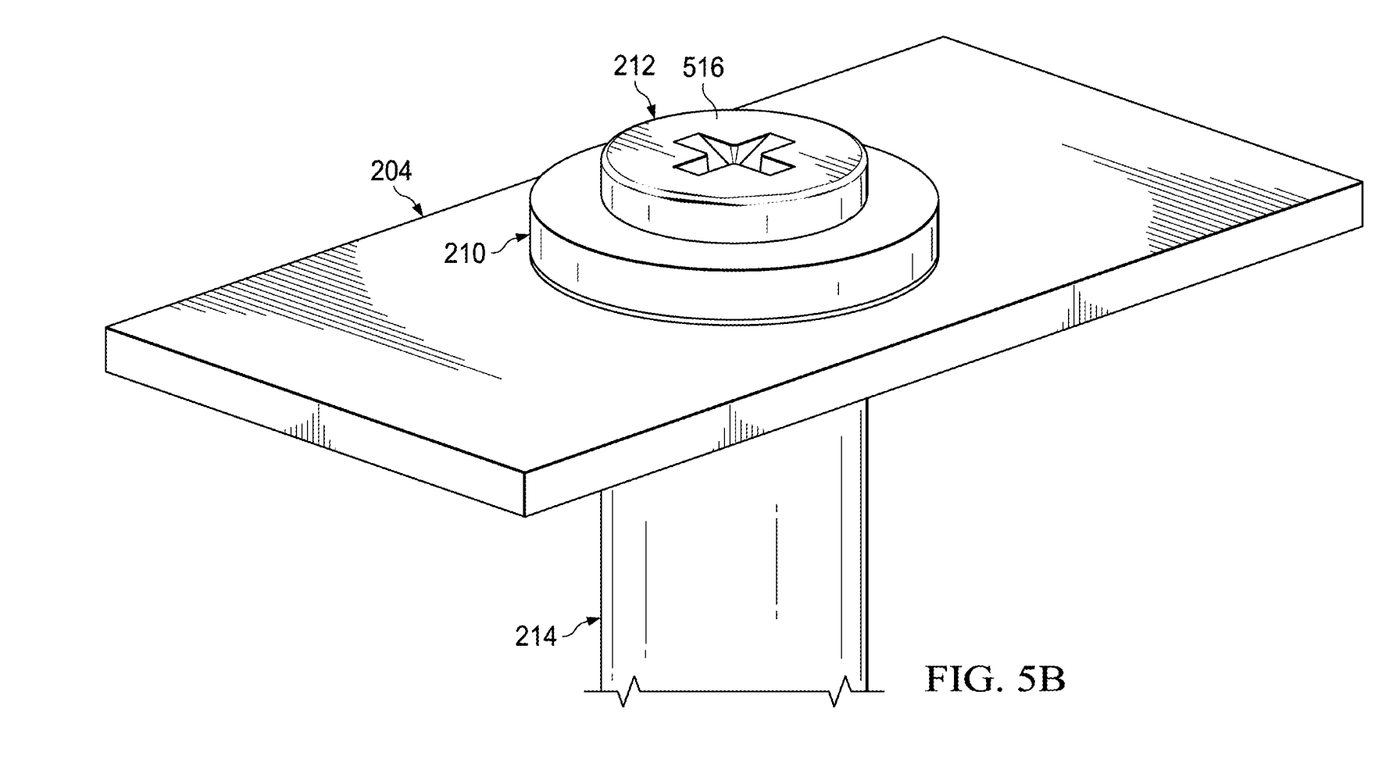
Figure 5C:
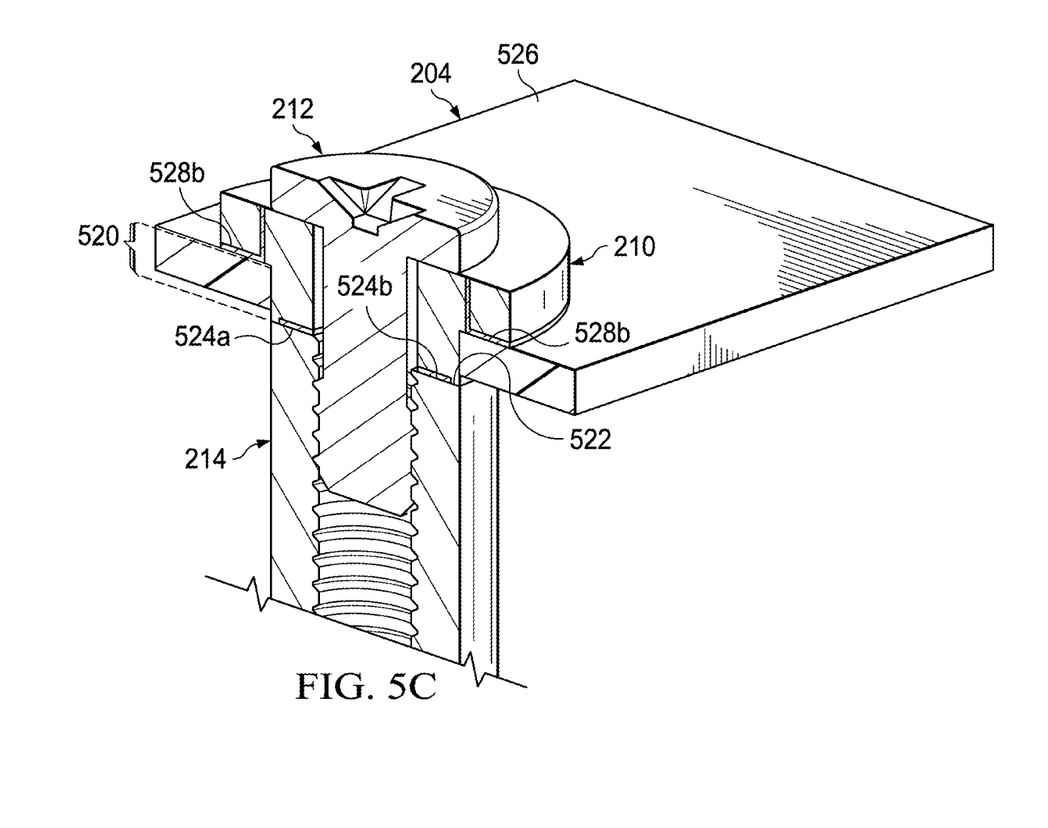

FIGS. 5A-5C illustrate coupling between the fastener 212, the screw boss assembly 210, the printed circuit board 204, and the structural boss assembly 214, in a first implementation. Specifically, FIG. 5A illustrates an exploded view of the fastener 212, the screw boss assembly 210, the printed circuit board 204, and the structural boss assembly 214. In short, the fastener 212 can couple the PCB 204 to the structural boss assembly 214. The fastener 212 can be positioned through the egress 310 of the screw boss assembly 210 and an egress 510 of the PCB 204 such that threaded portions 512 of the fastener 212 engage with corresponding threaded portions (not shown) of the structural boss assembly 214, securing the PCB 204 to the structural boss assembly 214. When the fastener 212 is engaged with the structural boss assembly 214, as shown in FIG. 5B, a head 516 of the fastener 212 is in contact with the screw boss assembly 210. Further, a portion 520 of the screw boss assembly 210 can be positioned within the egress 510 of the PCB 204, as shown in FIG. 5C.

To that end, when the fastener 212 is engaged with the structural boss assembly 214, and in particular, the screw boss assembly 210 is engaged with the fastener 212, the PCB 210, and the structural boss 214, the bottom surface 306 of the substrate 302 and the first contacting member 330 of the insert 304 can be in contact with a top surface 522 of the structural boss assembly 214. In particular, the first contacting member 330 of the insert 304 is in electrical contact (or electrical communication) with the structural boss assembly 214 when the screw boss assembly 210 is positioned adjacent to the structural boss assembly 214. That is, the first contacting member 330 of the insert 304 forms electronical contacts at points 524a, 524b with the structural boss assembly 214 when the screw boss assembly 210 is positioned adjacent to the structural boss assembly 214. Thus, at points 524a, 524b, the insert 304 can maintain contact with the structural boss assembly 214 for electromagnetic compatibility (EMC) and/or electrostatic discharge (ESD).

Furthermore, when the fastener 212 is engaged with the structural boss assembly 214, and in particular, the screw boss assembly 210 is engaged with the fastener 212, the PCB 210, and the structural boss 214, the second contacting member 332 of the insert 304 can be in contact with a top surface 526 of the PCB 210. In particular, the second contacting member 332 of the insert 304 is in electrical contact (or electrical communication) with the PCB 204 when the screw boss assembly 210 is positioned adjacent to the PCB 204. That is, the second contacting member 332 of the insert 304 forms electronical contacts at points 528a, 528b with the PCB 204 when the screw boss assembly 210 is positioned adjacent to the PCB 204. Thus, at points 528a, 528b, the insert 304 can maintain contact with the PCB 204 for electromagnetic compatibility (EMC) and/or electrostatic discharge (ESD).

Thus, electrically charge/contact can be passed from the PCB 204 to the structural boss assembly 214. Electric charge can be passed from the PCB 204 to the insert 304 and eventually to the structural boss assembly 214. Specifically, electric charge can be passed from the PCB 204 to the second contacting member 332 of the insert 304 to the connecting members 334 of the insert 304 to the first contacting members 330 of the insert 304 to the structural boss assembly 214.

Additionally, when the fastener 212 is engaged with the structural boss assembly 214, and in particular, the screw boss assembly 210 is engaged with the fastener 212, the PCB 210, and the structural boss 214, the substrate 302 can be in contact with the fastener 212, the PCB 204, and the structural boss assembly 214. In particular, the substrate 302 is in thermal contact (or thermal communication) with the fastener 212, the PCB 204, and the structural boss assembly 214. The substrate 302 of the screw boss assembly 210 can isolate and/or resist heat transfer between the fastener 212 to the PCB 204 and to the structural boss assembly 214 and the insert 304 of the screw boss assembly 210 can isolate and/or resist heat transfer between the PCB 204 to the structural boss assembly 214.

As a result, the screw boss assembly 210 can provide i) electrical grounding connection for the PCB 204 to the structural boss assembly 214 while also providing ii) heat resistance between the fastener 212, the PCB 204, and the structural boss assembly 214.

Figure 6A:
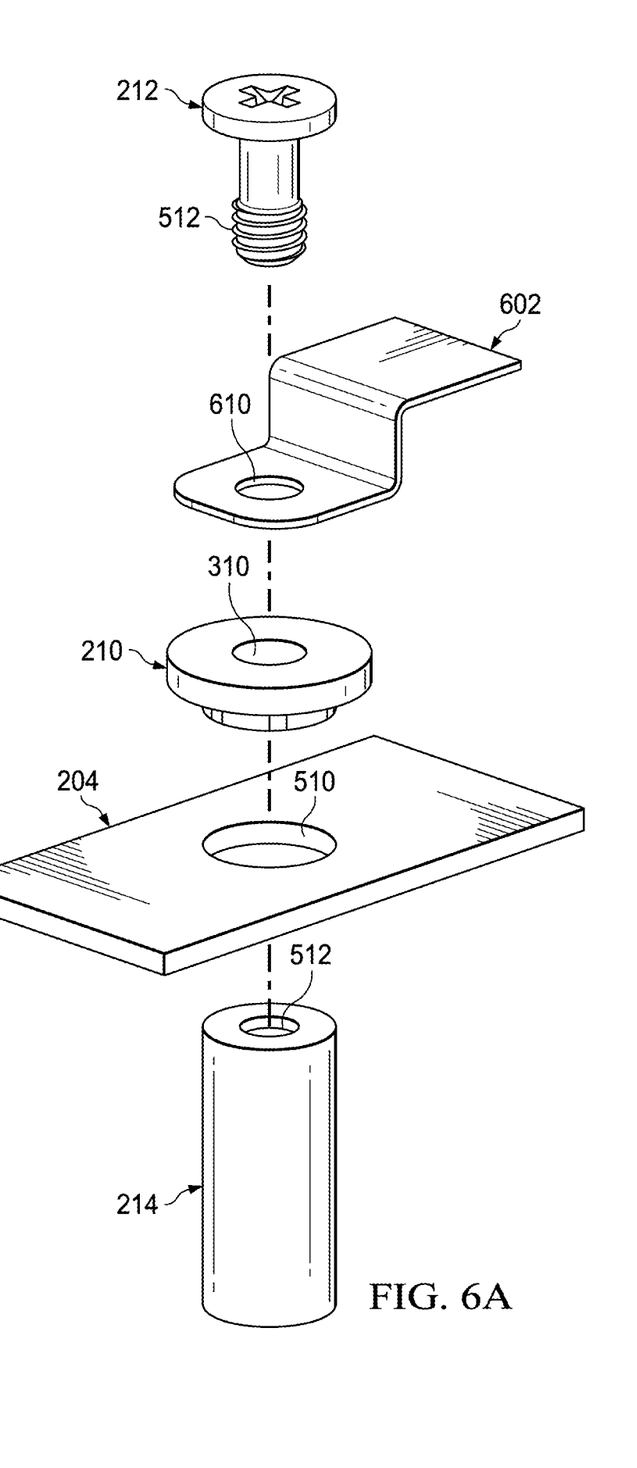
FIGS. 6A, 6B, 6C illustrate coupling between a screw, a conductive insert, the screw boss assembly, a printed circuit board, and a structural boss, in a second implementation.
Figure 6B:
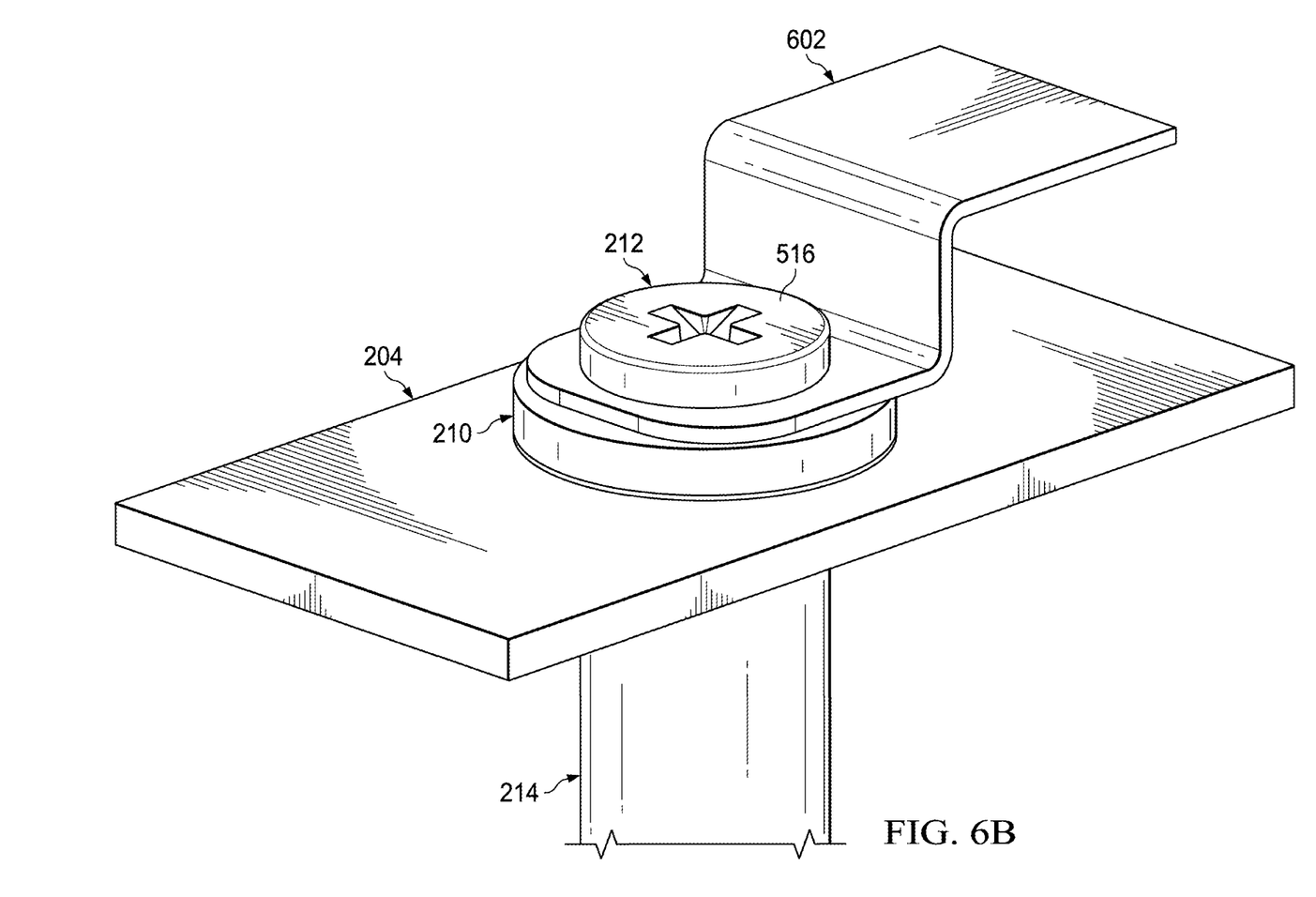
Figure 6C:
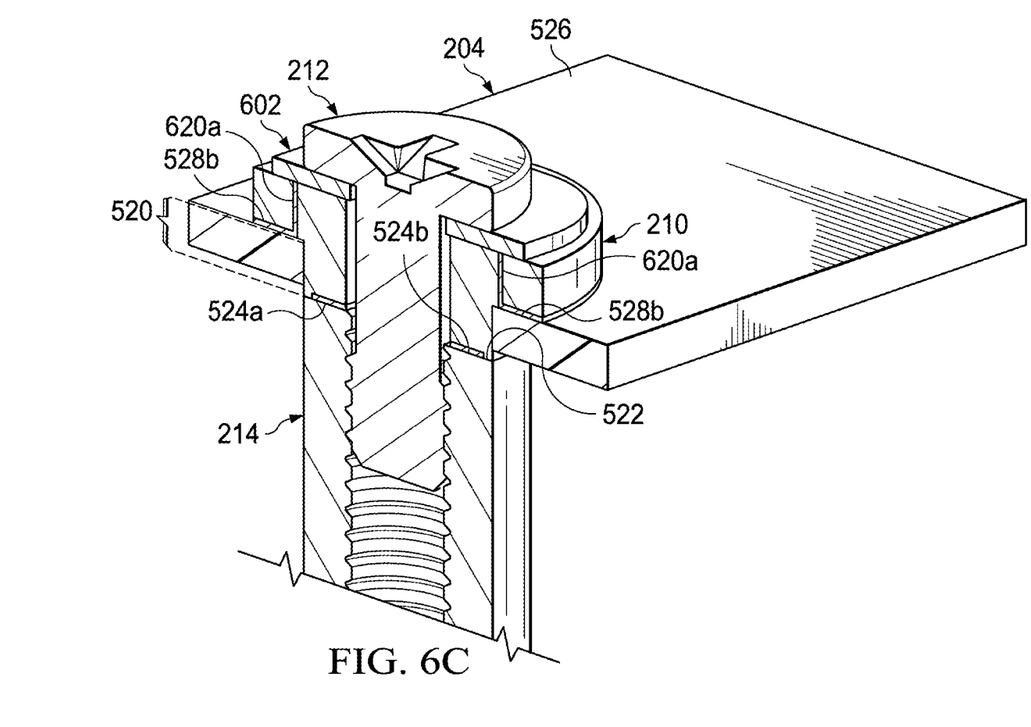

FIGS. 6A-6C illustrate coupling between the fastener 212, the screw boss assembly 210, the printed circuit board 204, the structural boss assembly 214 and a conductive insert 602, in a second implementation. Specifically, FIG. 6A illustrates an exploded view of the fastener 212, the screw boss assembly 210, the printed circuit board 204, the conductive insert 602 and the structural boss assembly 214. In short, the fastener 212 can couple the conductive insert 602 and the PCB 204 to the structural boss assembly 214. The fastener 212 can be positioned through the egress 310 of the screw boss assembly 210, an egress 610 of the conductive insert 602 and the egress 510 of the PCB 204 such that threaded portions 512 of the fastener 212 engage with corresponding threaded portions (not shown) of the structural boss assembly 214, securing the conductive insert 602 and the PCB 204 to the structural boss assembly 214. When the fastener 212 is engaged with the structural boss assembly 214, as shown in FIG. 6B, the head 516 of the fastener 212 is in contact with the conductive insert 602. Further, the portion 520 of the screw boss assembly 210 can be positioned within the egress 510 of the PCB 204, as shown in FIG. 6C.

To that end, when the fastener 212 is engaged with the structural boss assembly 214, and in particular, the screw boss assembly 210 is engaged with the fastener 212, the PCB 210, the conductive insert 602, and the structural boss 214, the bottom surface 306 of the substrate 302 and the first contacting member 330 of the insert 304 can be in contact with the top surface 522 of the structural boss assembly 214. In particular, the first contacting member 330 of the insert 304 is in electrical contact (or electrical communication) with the structural boss assembly 214 when the screw boss assembly 210 is positioned adjacent to the structural boss assembly 214. That is, the first contacting member 330 of the insert 304 forms electronical contacts at the points 524a, 524b with the structural boss assembly 214 when the screw boss assembly 210 is positioned adjacent to the structural boss assembly 214. Thus, at the points 524a, 524b, the insert 304 can maintain contact with the structural boss assembly 214 for electromagnetic compatibility (EMC) and/or electrostatic discharge (ESD).

Furthermore, when the fastener 212 is engaged with the structural boss assembly 214, and in particular, the screw boss assembly 210 is engaged with the fastener 212, the PCB 210, the conductive insert 602, and the structural boss 214, the second contacting member 332 of the insert 304 can be in contact with the top surface 526 of the PCB 210. In particular, the second contacting member 332 of the insert 304 is in electrical contact (or electrical communication) with the PCB 204 when the screw boss assembly 210 is positioned adjacent to the PCB 204. That is, the second contacting member 332 of the insert 304 forms electrical contacts at the points 528a, 528b with the PCB 204 when the screw boss assembly 210 is positioned adjacent to the PCB 204. Thus, at the points 528a, 528b, the insert 304 can maintain contact with the PCB 204 for electromagnetic compatibility (EMC) and/or electrostatic discharge (ESD).

Additionally, when the fastener 212 is engaged with the structural boss assembly 214, and in particular, the screw boss assembly 210 is engaged with the fastener 212, the PCB 210, the conductive insert 602, and the structural boss 214, the tabs 338 of the insert 304 can be in contact with the conductive insert 602. In particular, the tabs 338 of the insert 304 are in electrical contact (or electrical communication) with the conductive insert 602 when the screw boss assembly 210 is positioned adjacent to the conductive insert 602. That is, the tabs 338 of the insert 304 form electrical contacts at points 620a, 620b with the conducive insert 602 when the screw boss assembly 210 is positioned adjacent to the conducive insert 602. Thus, at the points 620a, 620b, the insert 304 can maintain contact with the conductive insert 602 for electromagnetic compatibility (EMC) and/or electrostatic discharge (ESD).

Thus, electrically charge/contact can be passed from the PCB 204 and/or the conductive insert 602 to the structural boss assembly 214. Electric charge can be passed from the PCB 204 and/or the conductive insert 602 to the insert 304 and eventually to the structural boss assembly 214. Specifically, electric charge can be passed from the PCB 204 and/or the conductive insert 602 to the second contacting member 332 of the insert 304 to the connecting members 334 of the insert 304 to the first contacting members 330 of the insert 304 to the structural boss assembly 214.

Additionally, when the fastener 212 is engaged with the structural boss assembly 214, and in particular, the screw boss assembly 210 is engaged with the fastener 212, the PCB 210, the conductive insert 602, and the structural boss 214, the substrate 302 can be in contact with the conductive insert 602, the PCB 204, and the structural boss assembly 214. In particular, the substrate 302 is in thermal contact (or thermal communication) with the conductive insert 602, the PCB 204, and the structural boss assembly 214. The substrate 302 of the screw boss assembly 210 can isolate and/or resist heat transfer between the conductive insert 602 to the PCB 204 and to the structural boss assembly 214 and the insert 304 of the screw boss assembly 210 can isolate and/or resist heat transfer between the PCB 204 to the structural boss assembly 214.

As a result, the screw boss assembly 210 can provide i) electrical grounding connection for the PCB 204/conductive insert 602 to the structural boss assembly 214 while also providing ii) heat resistance between the conductive insert 602, the PCB 204, and the structural boss assembly 214.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A screw boss assembly, including:
   a plastic substrate, including:
      i) a bottom surface including a first channel;
      ii) an indented surface;
      iii) a sidewall surface connecting the bottom surface and the indented surface, the sidewall surface including second channels, each of the second channels connected to the first channel;
   a metal insert, including:
      i) a first contacting member;
      i) a second contacting member;
      ii) connecting members connecting the first contacting member to the second contacting member;
   wherein the metal insert is coupled with the plastic substrate such that the first contacting member is positioned within the first channel and the connecting members are positioned within respective second channels.

2. The screw boss assembly of claim 1, wherein the metal insert is coupled with the plastic substrate such that the second contacting member is positioned adjacent to the indented surface.

3. The screw boss assembly of claim 1, the first contacting member is positioned within the first channel such that a surface of the first contacting member is flush with the bottom surface of the plastic substrate.

4. The screw boss assembly of claim 1, the connecting members are positioned within respective second channels such that respective surfaces of the connecting members are flush with the sidewall surface of the plastic substrate.

5. The screw boss assembly of claim 1, wherein the plastic substrate includes an egress.

6. The screw boss assembly of claim 1, wherein the plastic substrate further includes a top surface positioned opposite to the bottom surface, the top surface including openings, wherein the metal insert includes tabs extending from the second contacting member, wherein the metal insert is coupled with the plastic substrate such that the tabs of the metal insert are positioned with the openings of the plastic substrate.

7. The screw boss assembly of claim 6, wherein the metal insert is coupled with the plastic substrate such that the tabs of the metal insert are positioned with the openings of the plastic substrate and flush with the top surface of the plastic substrate.

8. The screw boss assembly of claim 6, wherein the metal insert is coupled with the plastic substrate such that the tabs of the metal insert are positioned with the openings of the plastic substrate and extend above the top surface of the plastic substrate.

9. The screw boss assembly of claim 1, wherein the first contacting member includes extension contacting members extending from the first contacting member, the extension contacting members connected the first contacting member with the connecting members.

10. The screw boss assembly of claim 1, wherein the first contacting member of the metal insert is in electrical contact with a structural boss when the screw boss assembly is positioned adjacent to the structural boss.

11. The screw boss assembly of claim 1, wherein the second contacting member of the metal insert is in electrical contact with a circuit board when the screw boss assembly is positioned adjacent to the circuit board.

12. The screw boss assembly of claim 6, wherein the tabs of the metal insert are in electrical contact with a conductive insert when the screw boss assembly is positioned adjacent to the conductive insert.

13. The screw boss assembly of claim 1, wherein the plastic substrate is in thermal contact with a screw and a structural boss.

14. An information handling system, comprising:
a processor;
memory media storing instructions executable by the processor to perform operations;
a screw boss assembly, including:
   a plastic substrate, including:
     i) a bottom surface including a first channel;
     ii) an indented surface;
     iii) a sidewall surface connecting the bottom surface and the indented surface, the sidewall surface including second channels, each of the second channels connected to the first channel;
   a metal insert, including:
     i) a first contacting member;
     ii) a second contacting member;
     iii) connecting members connecting the first contacting member to the second contacting member;
   wherein the metal insert is coupled with the plastic substrate such that the first contacting member is positioned within the first channel and the connecting members are positioned within respective second channels.

15. The information handling system of claim 14, wherein the metal insert is coupled with the plastic substrate such that the second contacting member is positioned adjacent to the indented surface.

16. The information handling system of claim 14, the first contacting member is positioned within the first channel such that a surface of the first contacting member is flush with the bottom surface of the plastic substrate.

17. The information handling system of claim 14, the connecting members are positioned within respective second channels such that respective surfaces of the connecting members are flush with the sidewall surface of the plastic substrate.

18. The information handling system of claim 14, wherein the plastic substrate includes an egress.

19. The information handling system of claim 14, wherein the plastic substrate further includes a top surface positioned opposite to the bottom surface, the top surface including openings, wherein the metal insert includes tabs extending from the second contacting member, wherein the metal insert is coupled with the plastic substrate such that the tabs of the metal insert are positioned with the openings of the plastic substrate.

20. The information handling system of claim 19, wherein the metal insert is coupled with the plastic substrate such that the tabs of the metal insert are positioned with the openings of the plastic substrate and flush with the top surface of the plastic substrate.

\* \* \* \* \*